US012537161B2

(12) United States Patent
Sinclair et al.

(10) Patent No.: US 12,537,161 B2
(45) Date of Patent: Jan. 27, 2026

(54) DOSE CUP ASSEMBLY FOR AN ION IMPLANTER

(71) Applicant: Applied Materials, Inc., Santa Clara, CA (US)

(72) Inventors: Frank Sinclair, Hartland, ME (US); Paul Joseph Murphy, Reading, MA (US); Bon-Woong Koo, Andover, MA (US); Gregory Edward Stratoti, Sandown, NH (US); Tseh-Jen Hsieh, Rowley, MA (US); Glenn Green, Woburn, MA (US)

(73) Assignee: Applied Materials, Inc., Santa Clara, CA (US)

( * ) Notice: Subject to any disclaimer, the term of this patent is extended or adjusted under 35 U.S.C. 154(b) by 578 days.

(21) Appl. No.: 18/101,260

(22) Filed: Jan. 25, 2023

(65) Prior Publication Data

US 2024/0249908 A1 Jul. 25, 2024

(51) Int. Cl.
*H01J 37/244* (2006.01)
*C23C 14/48* (2006.01)
(Continued)

(52) U.S. Cl.
CPC ............ *H01J 37/244* (2013.01); *C23C 14/48* (2013.01); *H01J 37/09* (2013.01); *H01J 37/3171* (2013.01);
(Continued)

(58) Field of Classification Search
CPC ...... H01J 37/244; H01J 37/09; H01J 37/3171; H01J 2237/0453; H01J 2237/24564;
(Continued)

(56) References Cited

U.S. PATENT DOCUMENTS 4,578,589 A * 3/1986 Aitken ................ H01J 37/3171 250/281
4,595,831 A * 6/1986 Hetherington, Jr. .. H01J 49/025 250/281

(Continued)

FOREIGN PATENT DOCUMENTS

JP H05217541 A * 8/1993
KR 10-1423615 B1 7/2014

(Continued)

OTHER PUBLICATIONS

International Search Report and Written Opinion mailed Apr. 22, 2024 in corresponding PCT application No. PCT/US2023/083868.

*Primary Examiner* — David A Vanore
(74) *Attorney, Agent, or Firm* — Nields, Lemack & Frame, LLC

(57) ABSTRACT

A dose cup assembly that results in less particles in a process chamber is disclosed. The dose cup assembly includes a faceplate attached to a back wall of the process chamber, and having an opening; an aperture plate defining a plurality of slots; and a tunnel having walls and sidewalls and having a proximal end and a distal end, located between the faceplate and the aperture plate, such that the proximal end is nearer to the faceplate and the distal end is nearer to the aperture plate; wherein at least one of the faceplate, the walls, the sidewalls or the aperture plate has one or more exposed outer surfaces that comprise silicon. The exposed outer surfaces may be silicon. In some embodiments, the faceplate, the walls, the sidewalls or the aperture plate may be graphite, aluminum, or stainless steel which is coated with silicon or silicon carbide.

20 Claims, 5 Drawing Sheets

(51) Int. Cl.
*H01J 37/09* (2006.01)
*H01J 37/317* (2006.01)

(52) U.S. Cl.
CPC .................. *H01J 2237/0453* (2013.01); *H01J 2237/24564* (2013.01)

(58) Field of Classification Search
CPC .. H01J 2237/24405; H01J 2237/31703; C23C 14/48
See application file for complete search history.

(56) References Cited

U.S. PATENT DOCUMENTS

| | | | | |
|---|---|---|---|---|
| 4,816,693 | A * | 3/1989 | Rathmell | H01J 37/3171 250/397 |
| 4,847,504 | A * | 7/1989 | Aitken | H01J 37/3171 250/492.1 |
| 6,300,643 | B1 * | 10/2001 | Fang | H01J 37/32935 250/397 |
| 6,716,727 | B2 | 4/2004 | Walther | |
| 7,453,070 | B2 | 11/2008 | Gupta et al. | |
| 9,437,397 | B2 | 9/2016 | Blake | |
| 9,799,492 | B2 | 10/2017 | Blake | |
| 11,205,560 | B2 | 12/2021 | Potkins et al. | |
| 2001/0042827 | A1 * | 11/2001 | Fang | H01J 37/32412 250/283 |
| 2004/0084634 | A1 * | 5/2004 | Bechthold | H05H 7/04 315/505 |
| 2004/0251432 | A1 * | 12/2004 | Sano | H01J 37/304 250/492.21 |
| 2005/0082498 | A1 * | 4/2005 | White | H01J 37/3171 250/492.21 |
| 2006/0054840 | A1 * | 3/2006 | Madokoro | H01J 37/09 250/492.21 |
| 2008/0087846 | A1 | 4/2008 | Lee et al. | |
| 2010/0155593 | A1 * | 6/2010 | Sinclair | H01J 49/025 250/281 |
| 2011/0226739 | A1 * | 9/2011 | Allen | H01J 37/32633 118/723 R |
| 2012/0068081 | A1 * | 3/2012 | Chang | H01J 37/3171 250/397 |
| 2013/0035897 | A1 * | 2/2013 | Pandolfi | H01J 37/3171 250/394 |
| 2015/0136996 | A1 * | 5/2015 | Inada | H01J 37/3171 250/492.21 |
| 2017/0047210 | A1 * | 2/2017 | Schwieters | H01J 49/0027 |
| 2017/0047216 | A1 * | 2/2017 | Schwieters | H01J 49/061 |
| 2019/0368959 | A1 * | 12/2019 | Brucker | G01M 3/205 |
| 2023/0235449 | A1 * | 7/2023 | Burtner | C23C 14/48 118/723 R |
| 2024/0249908 | A1 * | 7/2024 | Sinclair | H01J 37/244 |

FOREIGN PATENT DOCUMENTS

| | | | | |
|---|---|---|---|---|
| WO | WO-0141183 | A1 * | 6/2001 | H01J 37/32412 |
| WO | 2022/089475 | A1 | 5/2022 | |
| WO | 2023/140953 | A1 | 7/2023 | |

* cited by examiner

DOSE CUP ASSEMBLY FOR AN ION IMPLANTER

This disclosure describes embodiments of a dose cup assembly for use in an ion implanter to measure ion beam current.

BACKGROUND

Semiconductor devices are fabricated using a plurality of processes, some of which implant ions into the workpiece. Certain implanters have the ability to monitor the ion beam that is being directed toward the workpiece. The incoming ion beam typically is very narrow in the height direction, but has a width that is greater than the diameter of the workpiece. This width may be achieved using a ribbon ion beam, or by the scanning of a spot ion beam.

To monitor this incoming ion beam, one or more current sensors, which may be Faraday cups or different sensors, may be located in the process chamber. These current sensors may be positioned such that when the workpiece is not in the operational position, the ion beam strikes the current sensors. The current sensors can then be used to measure the incoming beam current, as a function of position in the width direction. In some embodiments, there are a plurality of current sensors arranged in the width direction. In another embodiment, one current sensor is used which is capable of moving in the width direction.

A structure, referred to as the dose cup assembly, is used to align and guide the ion beam toward the current sensors. Due to the position of the current sensors, the dose cup assembly that protects the current sensors is exposed in the ion beam. This exposure may cause a film to be formed on the dose cup assembly, which may interfere with the operation of the current sensors. This film may be brittle such that it is susceptible to cracking. Consequently, particles may form in the process chamber due to the cracking of this film. Particles may result in a higher rate of preventive maintenance (PM) routines that would lower the overall throughput of the ion implanter.

Therefore, it would be beneficial if there were a dose cup assembly that was more resistant to the buildup of this film. Alternatively, it may be advantageous if ion beam exposure to the dose cup assembly caused a different type of film, which is less susceptible to cracking, to be formed.

SUMMARY

An ion implanter that includes an ion source to generate an ion beam, a platen disposed in a process chamber to support a workpiece that is treated with the ion beam, and dose cup assembly that results in fewer particles in a process chamber is disclosed. The dose cup assembly includes a faceplate attached to a back wall of the process chamber, the faceplate defining an opening; an aperture plate defining a plurality of slots; and a tunnel having walls and sidewalls and having a proximal end and a distal end, located between the faceplate and the aperture plate, such that the proximal end is nearer to the faceplate and the distal end is nearer to the aperture plate; and one or more current sensors disposed behind the plurality of slots in the aperture plate, such that the ion beam passes through the plurality of slots to the one or more current sensors. At least one of the faceplate, the walls, the sidewalls or the aperture plate has one or more exposed outer surfaces that comprise silicon. The exposed outer surfaces may be silicon. In some embodiments, the faceplate, the walls, the sidewalls or the aperture plate may be graphite, aluminum, or stainless steel which is coated with silicon or silicon carbide. In some embodiments, the faceplate, the walls, the sidewalls and the aperture plate all have one or more exposed outer surfaces that comprise silicon. In some embodiments, the one or more exposed outer surfaces comprise silicon. In some embodiments, the one or more exposed outer surfaces comprise a coating of silicon or silicon carbide. In certain embodiments, an underlying substrate beneath the coating comprises graphite, aluminum or stainless steel. In some embodiments, the walls of the tunnel are parallel to one another and the walls are made from silicon or are coated with silicon or silicon carbide. In some embodiments, a spacing between the walls of the tunnel is greater at the proximal end than the spacing between the walls of the tunnel at the distal end so as to taper inward moving toward the aperture plate. In some embodiments, a spacing between the sidewalls of the tunnel is smaller at the proximal end than the spacing between the sidewalls of the tunnel at the distal end so as to taper outward moving toward the aperture plate. In some embodiments, the aperture plate comprises a front support member and a rear slotted member, wherein the front support member is made from silicon or is coated with silicon or silicon carbide. In certain embodiments, the front support member and the rear slotted member are permanently bonded. In certain embodiments, the front support member and the rear slotted member are mechanically joined.

In another embodiment, a dose cup assembly configured to be disposed in a process chamber of an ion implanter is disclosed. The dose cup assembly comprises a faceplate configured to be attached to a back wall of the process chamber of the ion implanter, the faceplate defining an opening; an aperture plate defining a plurality of slots; and a tunnel having walls and sidewalls and having a proximal end and a distal end, located between the faceplate and the aperture plate, such that the proximal end is nearer to the faceplate and the distal end is nearer to the aperture plate; wherein at least one of the faceplate, the walls, the sidewalls or the aperture plate has one or more exposed outer surfaces that comprise silicon. In some embodiments, the faceplate, the walls, the sidewalls and the aperture plate all have one or more exposed outer surfaces that comprise silicon. In some embodiments, the one or more exposed outer surfaces comprise silicon. In some embodiments, the one or more exposed outer surfaces comprise a coating of silicon or silicon carbide. In certain embodiments, an underlying substrate beneath the coating comprises graphite, aluminum or stainless steel. In some embodiments, a spacing between the walls of the tunnel is greater at the proximal end than the spacing between the walls of the tunnel at the distal end so as to taper inward moving toward the aperture plate. In some embodiments, a spacing between the sidewalls of the tunnel is smaller at the proximal end than the spacing between the sidewalls of the tunnel at the distal end so as to taper outward moving toward the aperture plate. In some embodiments, the aperture plate comprises a front support member and a rear slotted member, wherein the front support member is made from silicon or is coated with silicon or silicon carbide. In certain embodiments, the front support member and the rear slotted member are permanently bonded. In certain embodiments, the front support member and the rear slotted member are mechanically joined.

According to another embodiment, a system for measuring beam current of an ion beam is disclosed. The system comprises the dose cup assembly described above and one or more current sensors disposed behind the plurality of slots in the aperture plate, wherein the ion beam is adapted to pass through the plurality of slots to the one or more current sensors.

BRIEF DESCRIPTION OF THE DRAWINGS

For a better understanding of the present disclosure, reference is made to the accompanying drawings, in which like elements are referenced with like numerals, and in which.

DETAILED DESCRIPTION

Figure 1:
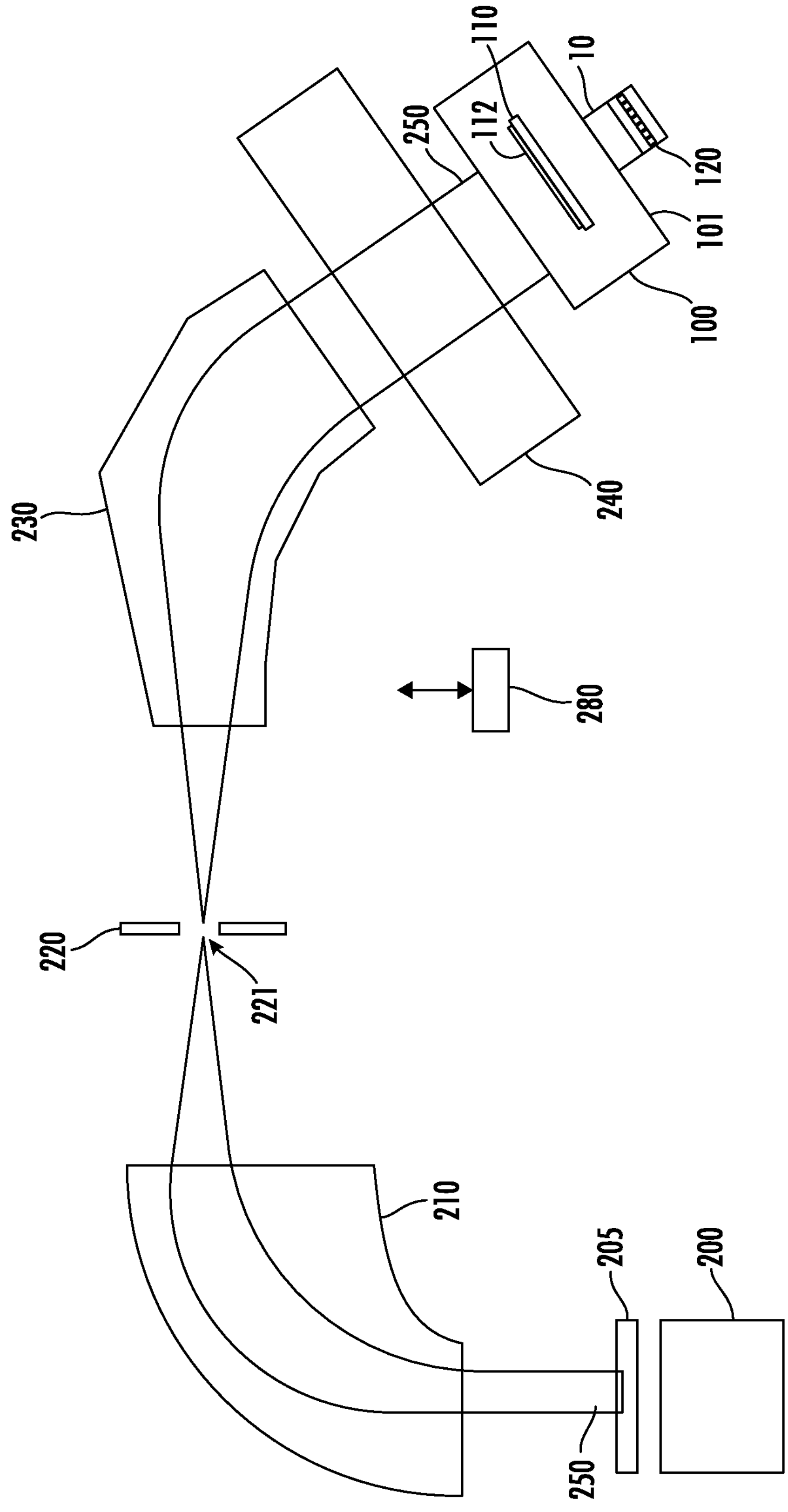
FIG. 1 is a block diagram of an ion implanter that uses the dose cup assembly according to one embodiment.

FIG. 1 shows an ion implanter that includes a process chamber 100 and a dose cup assembly 10. An ion source 200 is used to generate an ion beam 250. The ion source 200 may be a an indirectly heated cathode (IHC) ion source. Alternatively, the ion source 200 may be a capacitively coupled plasma source, an inductively coupled plasma source, a Bernas source or another source. Thus, the type of ion source is not limited by this disclosure. Disposed outside and proximate the extraction aperture of the ion source 200 is the extraction optics 205, which may comprise one or more electrodes.

Located downstream from the extraction optics 205 is a mass analyzer 210. The mass analyzer 210 uses magnetic fields to guide the path of the extracted ion beam. The magnetic fields affect the flight path of ions according to their mass and charge. A mass resolving device 220 that has a resolving aperture 221 is disposed at the output, or distal end, of the mass analyzer 210. By proper selection of the magnetic fields, only those ions in the ion beam 250 that have a selected mass and charge will be directed through the resolving aperture 221. Other ions will strike the mass resolving device 220 or a wall of the mass analyzer 210 and will not travel any further in the system.

A collimator 230 may disposed downstream from the mass resolving device 220. The collimator 230 accepts the ions from the ion beam 250 that pass through the resolving aperture 221 and creates an ion beam formed of a plurality of parallel or nearly parallel beamlets. The output, or distal end, of the mass analyzer 210 and the input, or proximal end, of the collimator 230 may be a fixed distance apart. The mass resolving device 220 is disposed in the space between these two components.

Located downstream from the collimator 230 may be an acceleration/deceleration stage 240. The acceleration/deceleration stage 240 is a beam-line lens component configured to independently control deflection, deceleration, and focus of the ion beam. For example, the acceleration/deceleration stage 240 may be an electrostatic filter (EF). The ion beam 250 that exits the acceleration/deceleration stage 240 enters the process chamber 100.

The process chamber 100 includes a platen 110, on which a workpiece 112 may be disposed. When in the operational position, the ion beam 250 impacts the workpiece 112. In addition, a dose cup assembly 10 is disposed at the back wall 101 of the process chamber 100. Located behind the dose cup assembly 10 may be one or more current sensors 120.

A controller 280 may be in communication with one or more of the power supplies such that the voltage or current supplied by these power supplies may be monitored and/or modified. The controller 280 may include a processing unit, such as microcontroller, a personal computer, a special purpose controller, or another suitable processing unit. The controller 280 may also include a non-transitory storage element, such as a semiconductor memory, a magnetic memory, or another suitable memory. This non-transitory storage element may contain instructions and other data that allows the controller 280 to perform the functions described herein.

In certain embodiments, the ion source 200 may generate a ribbon beam that travels through these components. Of course, other ion implanters may be utilized. For example, the ion implanter may generate a scanned ion beam rather than a ribbon ion beam. Such an ion implanter includes an ion source that creates a spot beam. This type of ion implanter also includes a mass analyzer and a mass resolving device, as described above. In addition, a scanner, which may be electrostatic or another type is used to create a scanned ion beam. The scanned ion beam may pass through an angle corrector. The angle corrector is designed to deflect ions in the scanned ion beam to produce an ion beam having parallel ion trajectories, thus focusing the scanned ion beam. Specifically, the angle corrector is used to alter the diverging ion trajectory paths into substantially parallel paths of the ion beam 250. In some embodiments, angle corrector may comprise magnetic pole pieces which are spaced apart to define a gap and a magnet coil which is coupled to a power supply. The scanned ion beam passes through the gap between the magnetic pole pieces and is deflected in accordance with the magnetic field in the gap. In other embodiments, the angle corrector may be an electrostatic lens sometimes referred to as a parallelizing lens.

Figure 2:
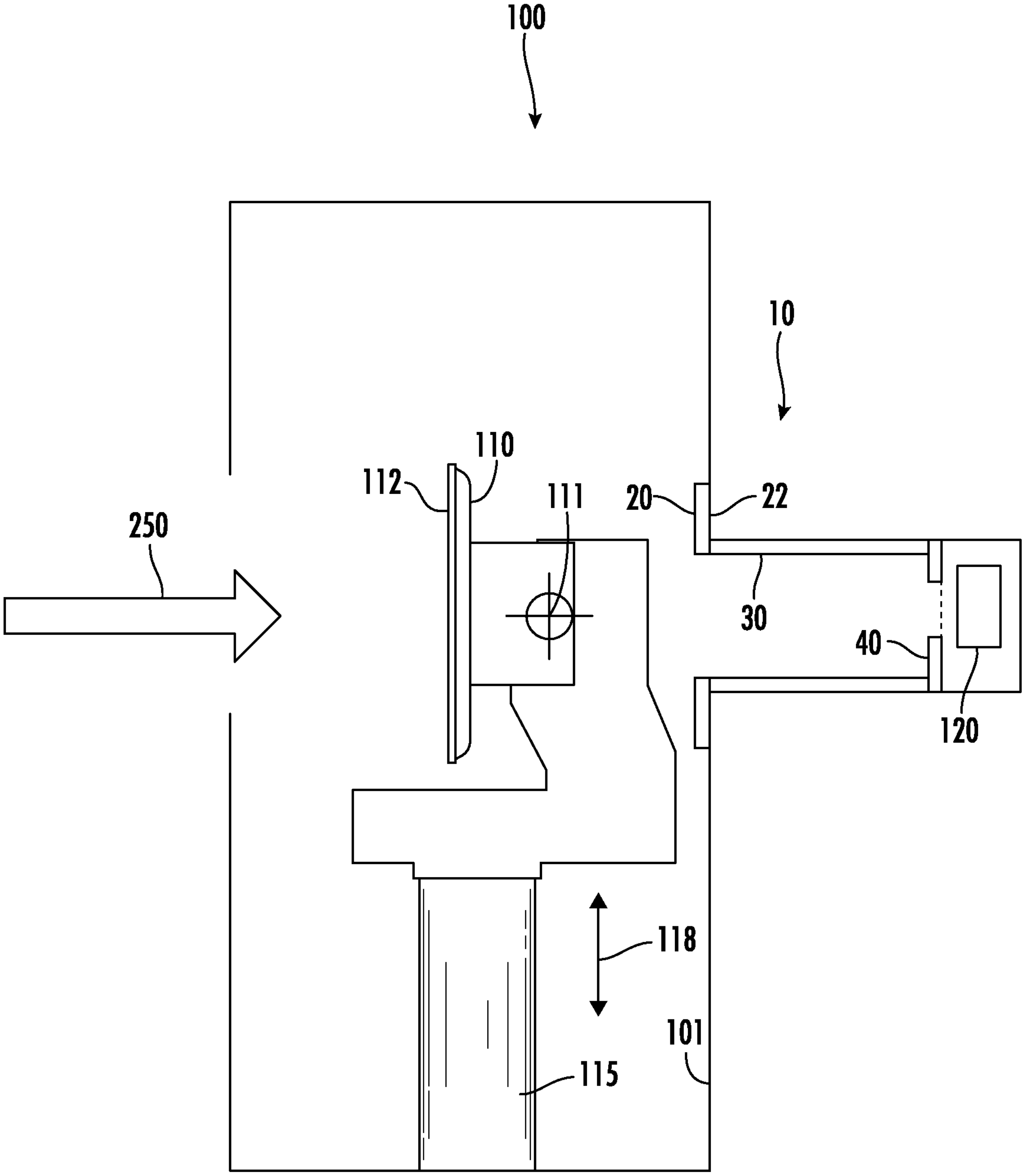
FIG. 2 is a block diagram of a process chamber with a dose cup assembly and a current sensor.

FIG. 2 shows the process chamber 100 of FIG. 1 in more detail. The process chamber 100 includes one or more current sensors 120. A dose cup assembly 10 is disposed between the incoming ion beam 250 and the current sensors 120. A platen 110 is also disposed in the process chamber 100. The platen 110 may be an electrostatic platen that is used to clamp and hold the workpiece 112 while the ion beam 250 is directed into the process chamber 100. In some embodiments, the platen 110 may be elevated and lowered in a Y direction 118 through the movement of shaft 115. Additionally, the platen 110 may rotate about X axis 111. In certain embodiments, the platen 110 may be rotated 90° so that the clamping surface of the platen 110 is horizontal, allowing a workpiece 112 to be placed on the platen 110. The platen 110 is then rotated into the operational, or implant position, which is shown in FIG. 2.

To monitor the ion beam 250, the platen 110 is lowered by actuation of shaft 115 in the Y direction 118. This movement removes the platen 110 from the path of the ion beam 250. Thus, the ion beam 250 is unobstructed as it travels toward the current sensors 120. As described in more detail below, the dose cup assembly 10 is used to guide and align the ion beam 250 with the current sensors 120.

Figure 3B:
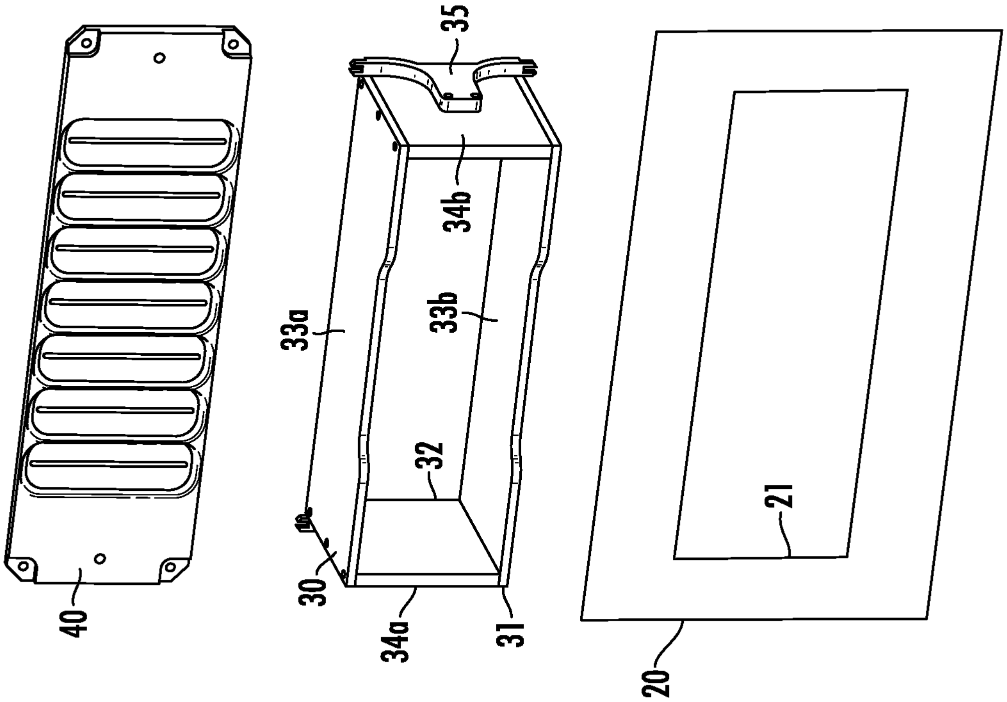
FIG. 3B shows the components that make up the dose cup assembly.
Figure 3A:
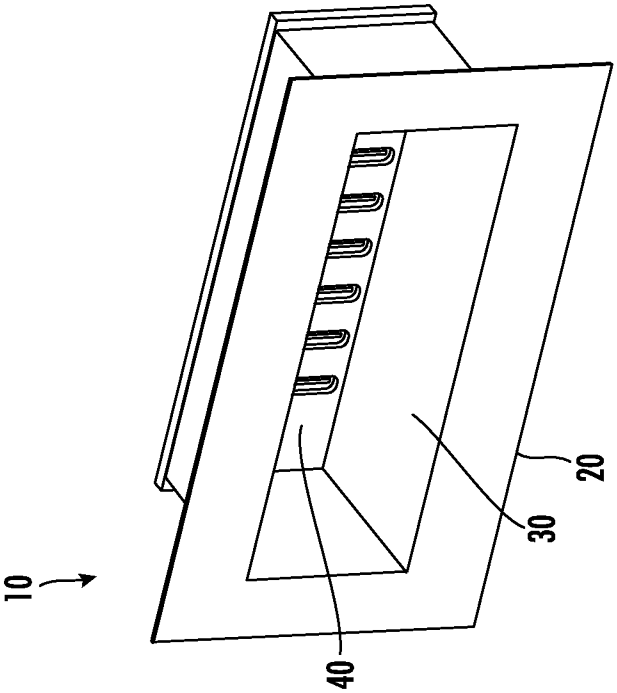
FIG. 3A shows the dose cup assembly.

FIG. 3A shows a view of the dose cup assembly 10 that is used in the process chamber 100 of FIG. 2. FIG. 3B shows an exploded view of the dose cup assembly 10 that illustrates the individual components. The dose cup assembly 10 includes a faceplate 20. As seen in FIG. 2, the faceplate 20 is attached to the back wall 101 of the process chamber 100 and covers the gap between the back wall 101 and the tunnel 30. The faceplate 20 defines an opening 21 which allows ions to pass through to the current sensors 120.

The tunnel 30 extends backward from the faceplate 20. The term "backward" refers to the direction along the direction of the ion beam 250 and further away from the source of the ion beam 250. In some embodiments, the proximal end 31 of the tunnel 30 contacts the back surface 22 of the faceplate 20. In other embodiments, a gap may exist between the proximal end 31 of the tunnel 30 and the back surface 22 of the faceplate 20.

The aperture plate 40 is coupled to the tunnel 30. The aperture plate 40 defines a plurality of slots 41 through which ions may pass. In some embodiments, the slots 41 may be between 2-6 inches in height and 1/16-1/4 inches in width. Brackets 35 may be used to affix the tunnel 30 to the aperture plate 40. In some embodiments, the aperture plate 40 contacts the distal end 32 of the tunnel 30. In other embodiments, a gap may exist between the aperture plate 40 and the distal end 32. In one embodiment, seven current sensors 120 are disposed behind seven respective slots 41. Of course, other numbers of slots and current sensors may be utilized. In another embodiment, one current sensor 120 is used, which translates along the width direction of the ion beam 250 to collect current from each slot 41.

Thus, the tunnel 30 is located between the faceplate 20 and the aperture plate 40, wherein the proximal end 31 of the tunnel 30 is closer to the back surface 22 of the faceplate 20 and the distal end 32 of the tunnel is closer to the aperture plate 40. In some embodiments, the proximal end 31 may be in contact with or attached to the back surface 22 of the faceplate. In some embodiments, the distal end 32 may be in contact with portions of the aperture plate 40. In some embodiments, the tunnel 30 is attached to the aperture plate 40 using brackets 35.

Each component will be described in more detail. The aperture plate 40 may be between 0.25 and 0.75 inches thick, and, in some embodiments, may be made from a single piece of silicon. This single piece of silicon may be crystalline silicon or polysilicon. In another embodiment, the aperture plate 40 may be constructed from graphite, aluminum or stainless steel, which is then coated with silicon or silicon carbide. The coating may be between 50 and 100 μm thick.

Figure 4:
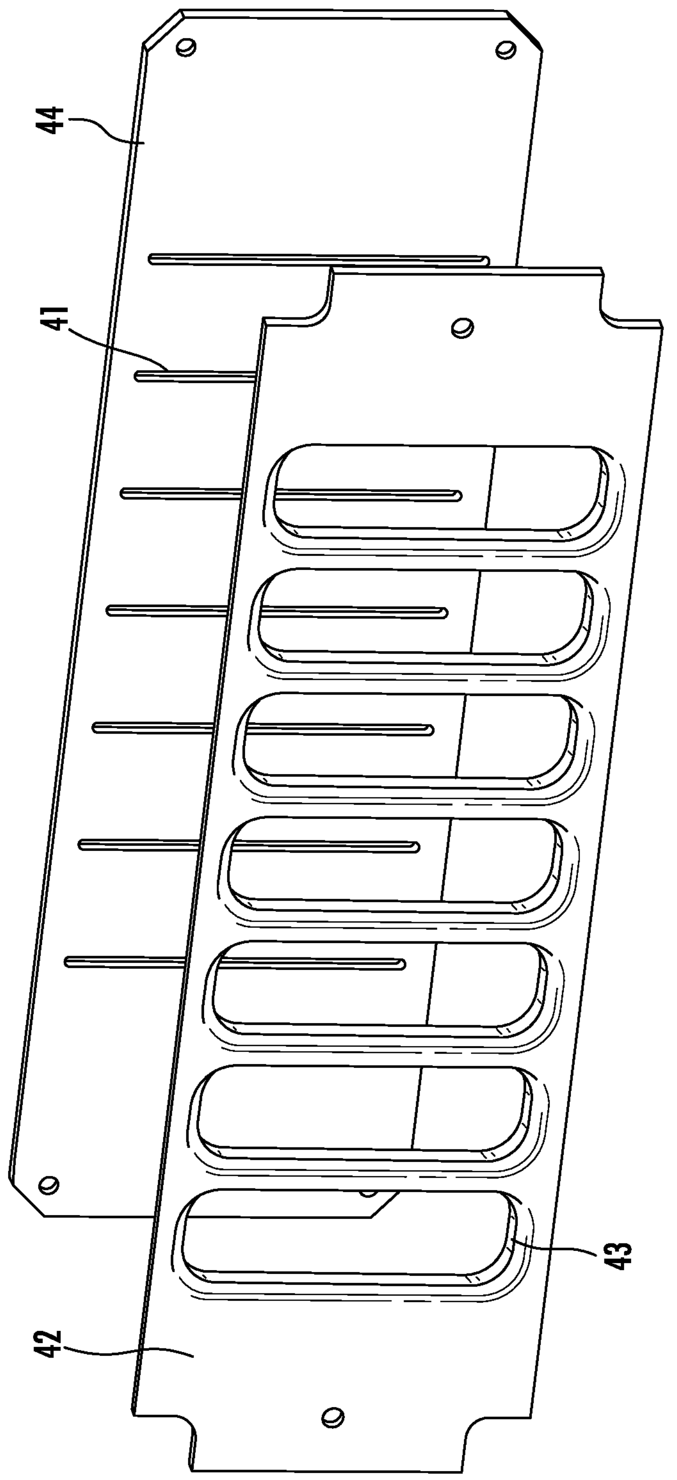
FIG. 4 shows the aperture plate used as part of the dose cup assembly according to one embodiment.

In another embodiment, shown in FIG. 4, the aperture plate 40 is made of multiple parts. The front support member 42 includes openings 43 that are wider and longer than the slots 41 so as to not obstruct the slots 41. This front support member 42 is used to provide structural integrity. The rear slotted member 44 includes the slots 41. The combined thickness of the front support member 42 and the rear slotted member 44 may be between 0.25 and 0.75 inches thick. In one embodiment, the rear surface of the front support member 42 is permanently bonded to the front surface of the rear slotted member 44. This may be accomplished using indium bonding. In another embodiment, the two components are mechanically joined using fasteners. In some embodiments, the front support member 42 and the rear slotted member 44 may be made of silicon, which may be crystalline silicon or polysilicon. Alternatively, the components may be made from graphite, aluminum or stainless steel, which is coated with silicon or silicon carbide, as described above. In another embodiment, the front support member 42 is made of silicon, or coated with silicon or silicon carbide, while the rear slotted member 44 is graphite.

In one embodiment, the tunnel 30, shown in FIG. 3B, comprises a set of walls 33*a*, 33*b* which are parallel to one another. The tunnel 30 also has a set of sidewalls 34*a*, 34*b* that are parallel to one another. The walls 33*a*, 33*b* and the sidewalls 34*a*, 34*b* extend a distance of between 4 and 8 inches from the proximal end 31 to the distal end 32. The walls 33*a*, 33*b* may have a length in the width direction of between 12 and 17 inches. The sidewalls 34*a*, 34*b* may have a length in the height direction of between 2 and 6 inches. The walls and sidewalls may be roughly 1 inch thick. In certain embodiments, the walls 33*a*, 33*b* and the sidewalls 34*a*, 34*b* are made from silicon, which may be crystalline silicon or polysilicon. In other embodiments, the walls 33*a*, 33*b* and the sidewalls 34*a*, 34*b* may be made of graphite, aluminum or stainless, coated with silicon or silicon carbide, as described above.

Figure 5A:
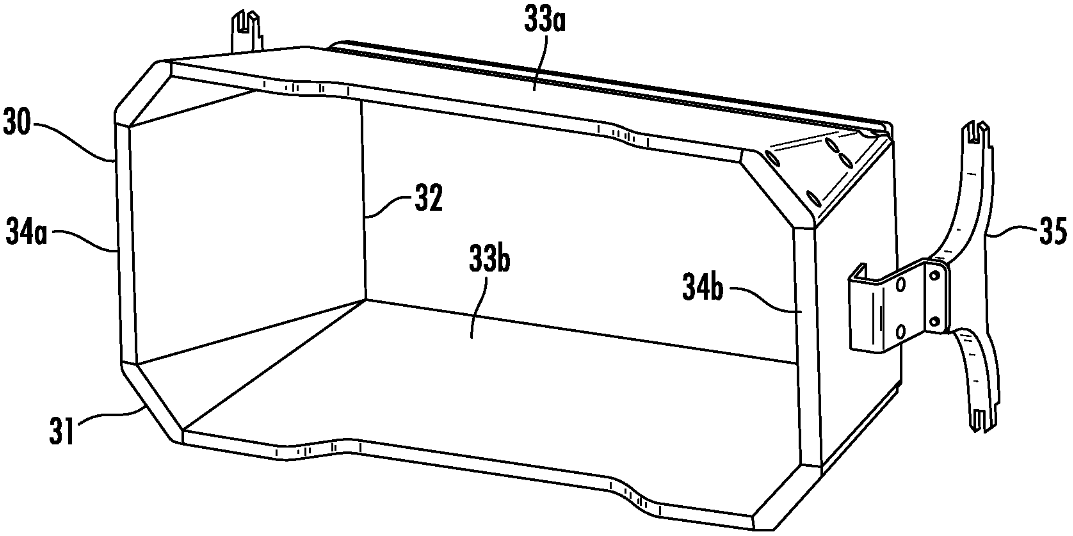
FIGS. 5A-5B show two embodiments of the tunnel used as part of the dose cup assembly.

Other embodiments are also possible. FIG. 5A shows a second embodiment of the tunnel 30, in which the walls 33*a*, 33*b* are closer to one another at the distal end 32 than at the proximal end 31. In other words, the walls 33*a*, 33*b* taper inward moving toward the aperture plate 40. In certain embodiments, the sidewalls 34*a*, 34*b* also taper inward moving toward the aperture plate 40. In some embodiments, the spacing between the walls 33*a*, 33*b* at the proximal end 31 is at least one inch greater than the spacing between the walls 33*a*, 33*b* at the distal end 32. In some embodiments, the spacing between the walls 33*a*, 33*b* at the proximal end 31 may be more than 2 inches greater than the spacing at the distal end 32. Similarly, in some embodiments, the spacing between the sidewalls 34*a*, 34*b* at the proximal end 31 is at least one inch greater than the spacing between the sidewalls 34*a*, 34*b* at the distal end 32. In some embodiments, the spacing between the sidewalls 34*a*, 34*b* at the proximal end 31 may be more than 3 inches greater than the spacing at the distal end 32.

Figure 5B:
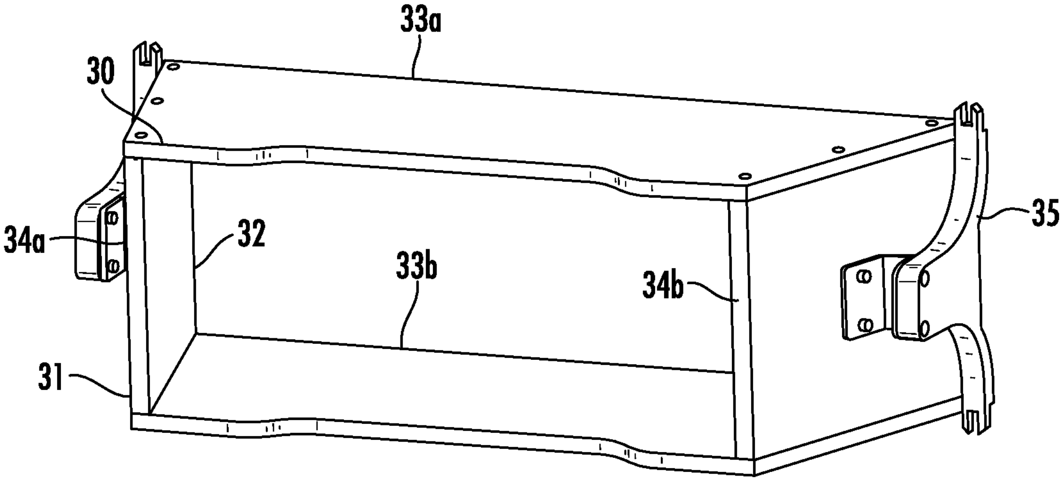

FIG. 5B shows a third embodiment of the tunnel 30, in which the sidewalls 34*a*, 34*b* are further from one another at the distal end 32 than at the proximal end 31. In other words, the sidewalls 34*a*, 34*b* taper outward moving toward the aperture plate 40. In some embodiments, the spacing between the sidewalls 34*a*, 34*b* at the proximal end 31 is at least one inch less than the spacing between the sidewalls 34*a*, 34*b* at the distal end 32. In some embodiments, the spacing between the sidewalls 34*a*, 34*b* at the proximal end 31 may be at least 3 inches less than the spacing at the distal end 32.

In the embodiments shown in FIGS. 3B and 5A-5B, the walls 33*a*, 33*b* and the sidewalls 34*a*, 34*b* may be made of silicon, which may be crystalline silicon or polysilicon. Alternatively, the walls 33*a*, 33*b* and the sidewalls 34*a*, 34*b* may be made of graphite, aluminum or stainless steel, coated with silicon or silicon carbide, as described above.

Lastly, the dose cup assembly includes a faceplate 20. As noted above, the faceplate 20 defines an opening 21. The opening is sized to be roughly the same dimensions as the perimeter formed by the walls 33*a*, 33*b* and sidewalls 34*a*, 34*b* at the proximal end 31. In this way, the opening 21 is aligned with the proximal end of the tunnel 30. Thus, depending on which embodiment of the tunnel 30 is used, the opening 21 may differ in size. The thickness of the faceplate 20 may be between 0.25 and 1 inch. The faceplate 20 may be constructed of silicon, which may be crystalline silicon or polysilicon. In other embodiments, the faceplate 20 may be coated with silicon or silicon carbide. In these embodiments, the faceplate may be graphite or a metal, such as aluminum or stainless steel.

Thus, in some embodiments, at least one of the components that make up the dose cup assembly has one or more exposed outer surfaces that comprise silicon. These exposed outer surfaces may be pure silicon or may be a siliconcontaining compound, such as silicon carbide. In some embodiments, the exposed outer surface is a coating of silicon or silicon carbide and the underlying substrate is graphite, aluminum or stainless steel. In some embodiments, all of these components that make up the dose cup assembly have one or more exposed outer surfaces that comprise silicon.

The present system and method have many advantages. In certain current configurations, the species of the ion beam may interact with the material used to form the components that make up the dose cup assembly. For example, boron ions may interact with graphite components to form a film of boron carbide. This film may crack, forming particles. By redesigning one or more of the components of the dose cup assembly to have an outer surface that comprises silicon, the formation of this boron carbide film is reduced or minimized.

Additionally, changing the geometry of the tunnel 30 may have additional benefits. When the walls are parallel to one another, low energy ion beams, such as boron or phosphorus, may impact the walls at a glancing angle, causing deposition layers, which may flake. Changing the geometry of the tunnel 30 may address this issue. For example, if the tunnel 30 tapers outward moving toward the aperture plate 40, the number of ions that may strike the walls 33*a*, 33*b* and the sidewalls 34*a*, 34*b* is reduced. Since fewer ions strike the walls and sidewalls of the tunnel 30, the likelihood of forming an unwanted film is reduced. Alternatively, if the tunnel 30 tapers inward moving toward the aperture plate 40, the angle at which the ions strike the walls and sidewalls is increased. By increasing the angle of incidence, the ions are more likely sputter material from the walls, reducing the possibility of unwanted film deposition.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion implanter comprising:

an ion source to generate an ion beam;

a platen to support a workpiece that is treated with the ion beam, the platen positioned within a process chamber of the ion implanter;

a dose cup assembly comprising:

a faceplate attached to a back wall of the process chamber of the ion implanter, the faceplate defining an opening;

an aperture plate defining a plurality of slots; and a tunnel having walls and sidewalls and having a proximal end and a distal end, located between the faceplate and the aperture plate, such that the proximal end is nearer to the faceplate and the distal end is nearer to the aperture plate; and one or more current sensors disposed behind the plurality of slots in the aperture plate, wherein the ion beam passes through the plurality of slots to the one or more current sensors;

wherein at least one of the faceplate, the walls, the sidewalls or the aperture plate has one or more exposed outer surfaces that comprise silicon.

2. The ion implanter of claim 1, wherein the faceplate, the walls, the sidewalls and the aperture plate all have one or more exposed outer surfaces that comprise silicon.

3. The ion implanter of claim 1, wherein the one or more exposed outer surfaces comprise silicon.

4. The ion implanter of claim 1, wherein the one or more exposed outer surfaces comprise a coating of silicon or silicon carbide.

5. The ion implanter of claim 4, wherein an underlying substrate beneath the coating comprises graphite, aluminum or stainless steel.

6. The ion implanter of claim 1, wherein the walls of the tunnel are parallel to one another and the walls are made from silicon or are coated with silicon or silicon carbide.

7. The ion implanter of claim 1, wherein a spacing between the walls of the tunnel is greater at the proximal end than the spacing between the walls of the tunnel at the distal end so as to taper inward moving toward the aperture plate.

8. The ion implanter of claim 1, wherein a spacing between the sidewalls of the tunnel is smaller at the proximal end than the spacing between the sidewalls of the tunnel at the distal end so as to taper outward moving toward the aperture plate.

9. The ion implanter of claim 1, wherein the aperture plate comprises a front support member and a rear slotted member, wherein the front support member is made from silicon or is coated with silicon or silicon carbide.

10. The ion implanter of claim 9, wherein the front support member and the rear slotted member are permanently bonded.

11. The ion implanter of claim 9, wherein the front support member and the rear slotted member are mechanically joined.

12. A dose cup assembly configured to be disposed in a process chamber of an ion implanter, comprising:

a faceplate configured to be attached to a back wall of the process chamber of the ion implanter, the faceplate defining an opening;

an aperture plate defining a plurality of slots; and a tunnel having walls and sidewalls and having a proximal end and a distal end, located between the faceplate and the aperture plate, such that the proximal end is nearer to the faceplate and the distal end is nearer to the aperture plate;

wherein at least one of the faceplate, the walls, the sidewalls or the aperture plate has one or more exposed outer surfaces that comprise silicon.

13. The dose cup assembly of claim 12, wherein the faceplate, the walls, the sidewalls and the aperture plate all have one or more exposed outer surfaces that comprise silicon.

14. The dose cup assembly of claim 12, wherein the one or more exposed outer surfaces comprise silicon.

15. The dose cup assembly of claim 12, wherein the one or more exposed outer surfaces comprise a coating of silicon or silicon carbide.

16. The dose cup assembly of claim 15, wherein an underlying substrate beneath the coating comprises graphite, aluminum or stainless steel.

17. The dose cup assembly of claim 12, wherein a spacing between the walls of the tunnel is greater at the proximal end than the spacing between the walls of the tunnel at the distal end so as to taper inward moving toward the aperture plate.

18. The dose cup assembly of claim 12, wherein a spacing between the sidewalls of the tunnel is smaller at the proximal end than the spacing between the sidewalls of the tunnel at the distal end so as to taper outward moving toward the aperture plate.

19. The dose cup assembly of claim 12, wherein the aperture plate comprises a front support member and a rear slotted member, wherein the front support member is made from silicon or is coated with silicon or silicon carbide.

20. A system for measuring a beam current of an ion beam, comprising:

the dose cup assembly of claim 12; and one or more current sensors disposed behind the plurality of slots in the aperture plate, wherein the ion beam is adapted to pass through the plurality of slots to the one or more current sensors.

* * * * *